United States Patent
Gether

(10) Patent No.: US 9,964,569 B2
(45) Date of Patent: May 8, 2018

(54) DETECTION CIRCUIT AND DETECTION METHOD

(75) Inventor: Horst Gether, Straden (AT)

(73) Assignee: ams AG, Unterpremstaetten (AT)

( * ) Notice: Subject to any disclaimer, the term of this patent is extended or adjusted under 35 U.S.C. 154(b) by 231 days.

(21) Appl. No.: 14/129,095

(22) PCT Filed: Jun. 14, 2012

(86) PCT No.: PCT/EP2012/061361
§ 371 (c)(1),
(2), (4) Date: May 9, 2014

(87) PCT Pub. No.: WO2013/000727
PCT Pub. Date: Jan. 3, 2013

(65) Prior Publication Data
US 2014/0292308 A1 Oct. 2, 2014

(30) Foreign Application Priority Data

Jun. 30, 2011 (DE) .......................... 10 2011 106 030

(51) Int. Cl.
*G01R 19/14* (2006.01)
*H04M 1/60* (2006.01)
(Continued)

(52) U.S. Cl.
CPC .......... *G01R 19/14* (2013.01); *H04M 1/6058* (2013.01); *H04R 1/1041* (2013.01);
(Continued)

(58) Field of Classification Search
CPC ........... H04M 1/72527; H04M 1/6058; H04R 2420/05; H04R 29/004; H04R 1/1041; G01R 19/14
(Continued)

(56) References Cited

U.S. PATENT DOCUMENTS 4,864,627 A * 9/1989 Dugan ..................... H03G 7/00
381/106
4,894,863 A * 1/1990 Navratil .................. H04M 1/76
379/390.01

(Continued)

FOREIGN PATENT DOCUMENTS

| DE | 19619300 A1 | 11/1997 |
| JP | 2002141980 A | 5/2002 |
| WO | 2006/045617 A2 | 5/2006 |

OTHER PUBLICATIONS

"iPhone Headset to other Cell Phone Headset Jack Adapter—3.5mm 4 conductor TRRS Male to Female" Downloaded Jul. 6, 2011.

*Primary Examiner* — Son Le
*Assistant Examiner* — Akm Zakaria
(74) *Attorney, Agent, or Firm* — McDermott Will & Emery LLP

(57) ABSTRACT

A detection circuit (1) comprises a first and a second contact terminal (P1, P2) for connecting a microphone (HM) with a defined polarity. Furthermore, a first and a second switch (S1, S2) are provided and respectively connect the first and the second contact terminal (P1, P2) to a reference potential terminal (GND). A supply terminal (SUP) for supplying an input signal is either connected to the first contact terminal (P1) or to the second contact terminal (P2) via a third switch (S3). A measuring device (MS) for acquiring a measurement signal in response to the supplied input signal is coupled to a connection between the supply terminal (SUP) and the third switch (S3). An evaluation device is designed for setting a first switching configuration, in which the first switch (S1) is in an open state, the first contact terminal (P1) is connected to the supply terminal (SUP) via the third switch (S3), and the second contact terminal (P2) is connected to the reference potential terminal (GND) via the second switch (S2), in a test phase. The evaluation device (Continued)

(CTRL) is furthermore designed for comparing the measurement signal to a threshold value ($I_{MIC\_MAX}$, $U_{MIC\_MIN}$) in the test phase and for determining whether the polarity of a connected microphone (HM) is suitable for the first switching configuration based on this comparison.

18 Claims, 5 Drawing Sheets

(51) Int. Cl.
 *H04R 1/10* (2006.01)
 *H04R 29/00* (2006.01)
 *H04M 1/725* (2006.01)

(52) U.S. Cl.
 CPC ....... *H04R 29/004* (2013.01); *H04M 1/72527* (2013.01); *H04R 2420/05* (2013.01)

(58) Field of Classification Search
 USPC .......................................... 324/133
 See application file for complete search history.

(56) References Cited

U.S. PATENT DOCUMENTS

| | | | |
|---|---|---|---|
| 6,567,655 B1* | 5/2003 | Wietzke | H04R 3/12 |
| | | | 381/74 |
| 8,019,096 B2* | 9/2011 | Sander | H04R 1/1041 |
| | | | 381/122 |
| 9,148,720 B2* | 9/2015 | Li | H04R 3/00 |
| 2005/0201568 A1 | 9/2005 | Goyal | |
| 2008/0164994 A1 | 7/2008 | Johnson et al. | |
| 2008/0167092 A1* | 7/2008 | Ueda | H04M 1/6066 |
| | | | 455/575.2 |
| 2012/0134503 A1* | 5/2012 | Poulsen | H04R 29/004 |
| | | | 381/58 |
| 2012/0200172 A1* | 8/2012 | Johnson | H04R 29/001 |
| | | | 307/116 |
| 2014/0091642 A1* | 4/2014 | Kim | H04R 1/08 |
| | | | 307/127 |

* cited by examiner

DETECTION CIRCUIT AND DETECTION METHOD

The invention pertains to a detection circuit and a method for detecting a polarity of a microphone.

A microphone can be connected to many entertainment electronics devices and telecommunication electronics devices for voice recording purposes. For example, such a microphone is integrated into a headset that allows the hands-free communication with the electronic device.

In a number of electronic devices, such headsets with integrated microphone are connected to a corresponding socket by means of a jack plug, particularly a four-pole jack plug. A conventional contacting of such a jack plug is illustrated as an example in FIG. 6A. In this case, the two outer contact points of the plug are provided for a left and a right audio channel of the loudspeakers of the headset that are respectively identified by the reference symbols L and R in the drawing. An inner ring is provided for a reference potential terminal GND while the second ring from inside serves for transmitting a microphone signal MIC. The configuration of the plug illustrated in FIG. 6A is standardized, for example, in accordance with the Open Mobile Terminal Platform, OMTP.

However, a few manufacturers of headsets with microphones or corresponding electronic communication devices deviate from this standardized plug configuration. For example, these manufacturers utilize a plug configuration of the type illustrated in FIG. 6B, in which the contacts for the microphone signal MIC and the reference potential terminal GND are inverted.

Accordingly, a trouble-free operation in connection with a device featuring a standardized socket can only be achieved by utilizing a headset with integrated microphone and standardized plug configuration according to FIG. 6A. This applies analogously to devices and headsets with a deviating configuration according to FIG. 6B. If an attempt is made to connect plugs and sockets with respectively different configurations, the inversion of the terminal for the microphone signal MIC and the reference potential terminal GND may respectively lead to a limited or deficient functionality, particularly with respect to the microphone signal.

A user of such a headset or a corresponding electronic communication device is unable to visually identify or distinguish the plug configuration. A user attempting to use a single headset with microphone in connection with several different electronic communication devices may realize that this is impossible, if applicable, due to different configurations of the sockets such that the user has to rely on at least one second headset with microphone.

It is the objective of the invention to disclose an improved concept for the connection of a microphone, particularly a microphone that is integrated into a headset.

This objective is attained with the object of the independent claims. Embodiments and enhancements form the objects of the dependent claims.

Prior to the actual operation or utilization of a connected microphone, for example, it is checked whether the polarity of the connected microphone is suitable for a proper operation in a first switching configuration. For this purpose, a test signal is applied to corresponding terminals, and a current signal or voltage signal in response to the test signal is acquired and compared to a threshold value. Depending on this comparison, a certain polarity of the connected microphone can be deduced. If the polarity is determined to be correct, the switching configuration can be maintained. Otherwise, the switching configuration can be changed such that the connection polarity of the microphone is also changed, wherein a corresponding measurement and a comparison to the threshold value can also be carried out in this case.

In an embodiment, a detection circuit comprises a first and a second contact terminal for connecting a microphone with a defined polarity. The contact terminals are provided, in particular, for a microphone in which a correct polarity influences the proper operation of the microphone. The detection circuit furthermore comprises a first switch that connects the first contact terminal to a reference potential terminal and a second switch that connects the second contact terminal to the reference potential terminal. The detection circuit features a supply terminal for supplying an input signal that is either connected to the first contact terminal or to the second contact terminal via a third switch. The third switch consists, in particular, of a changeover switch. A measuring device of the detection circuit serves for acquiring a measurement signal in response to the supplied input signal and is coupled to a connection between the supply terminal and the third switch. The detection circuit furthermore comprises an evaluation device. The evaluation device is designed for setting a first switching configuration, in which the first switch is in an open state, the first contact terminal is connected to the supply terminal via the third switch, and the second contact terminal is connected to the reference potential terminal via the second switch, in a test phase. The evaluation device is furthermore designed for comparing the measurement signal to a threshold value and for determining whether the polarity of a connected microphone is suitable for the first switching configuration based on this comparison. This includes, in particular, that the switching configuration is suitable for a proper operation of the microphone.

According to one embodiment, the evaluation device is designed for respectively setting or maintaining the first switching configuration for an operating phase if the polarity of a connected microphone is suitable for the first switching configuration. Accordingly, the polarity of a connected microphone is determined, for example, in the first test phase and a switching configuration that allows the proper utilization of the microphone during its operation is set based on the determined polarity.

According to another embodiment, the evaluation device is designed for setting a second switching configuration, in which the second switch is in an open state, the first contact terminal is connected to the reference potential terminal via the first switch, and the second contact terminal is connected to the supply terminal via the third switch, if the polarity of a connected microphone is unsuitable for the first switching configuration. For example, the polarity of the connected microphone is accordingly inverted in comparison to the first switching configuration in the second test phase or in the second switching configuration.

It is therefore possible, for example, to design the evaluation device for maintaining or setting the second switching configuration for an operating phase if the polarity of a connected microphone is unsuitable for the first switching configuration.

In different embodiments, it is furthermore possible to design the evaluation device for comparing the measurement signal to the threshold value in an additional test phase with the second switching configuration, as well as for determining whether the polarity of a connected microphone is suitable for the second switching configuration based on this comparison. An improved certainty in the determination of the microphone polarity can be achieved due to the additional test phase.

In different embodiments, it is accordingly possible to design the evaluation device for maintaining or setting the second switching configuration for an operating phase if the polarity of a connected microphone is suitable for the second switching configuration.

According to another embodiment, the detection circuit furthermore comprises a limiting circuit that is coupled to the supply terminal and designed for limiting a value, particularly a current value of the input signal, to a limit value via the third switch. For example, the limit value may be adjustable in a time-variant fashion in this case.

In different embodiments, the limiting circuit is designed, for example, for allowing the limit value to increase from a minimum limit value to a maximum limit value in the test phase or in the additional test phase, wherein the increase is controlled, in particular, by the evaluation device.

For example, the increase of the limit value may also be stopped before the maximum limit value is reached, for example, if it is detected that the measurement signal exceeds the threshold value. In different embodiments, the limit value can be once again be returned to the minimum limit value after the maximum limit value has been reached or after the measurement signal has exceeded the threshold value. In different embodiments, the increase of the limit value, as well as a decrease of the limit value, may take place continuously, incrementally or progressively, preferably with monotonic graduation.

For example, the input signal made available at the supply terminal is a voltage signal that has, for example, a predetermined current-carrying capacity. In different embodiments, a current value of the input signal is limited by the limit value. The current limiting may be realized, for example, by means of a controlled resistor that in different embodiments features a controlled transistor. No current limiting or almost no current limiting preferably takes place in an operating phase.

According to another embodiment, the measuring device is designed for measuring a current through the connection between the supply terminal and the third switch. In this case, the evaluation device is designed for determining that the polarity of a connected microphone is suitable if the measured current is lower than a current threshold value in the test phase or in the additional test phase. The current measured through the connection between the supply terminal and the third switch corresponds, in particular, to the current that flows to the reference potential terminal via a connected microphone. In a microphone with a defined polarity such as, for example, an electret microphone, the microphone features inherent current limiting such that an operating current in the range of 200 µA to 500 µA, particularly around 300 µA, usually occurs.

If the connection polarity of such a microphone is inverted, the microphone has a current characteristic that resembles, for example, the current characteristic of a diode. Accordingly, higher currents that lie, for example, in the range of 2 mA to 4 mA may occur through the microphone in this case. Furthermore, the currents through the microphone may also become so high that the microphone is damaged or even destroyed.

When the usual operating current defined by a limit value is exceeded, it can accordingly be assumed that the connected microphone has an unsuitable polarity. For example, the current threshold value, to which the measured current is compared, may be chosen higher than a conventional operating current, e.g. in the range of 350 µA to 600 µA.

According to another embodiment, the measuring device is designed for measuring a voltage at the connection between the supply terminal and the third switch. In this case, the evaluation device is designed for determining that the polarity of a connected microphone is suitable if the measured voltage is higher than a voltage threshold value in the test phase or in the additional test phase. Since a microphone with a defined polarity has a diode-like characteristic when the connection polarity is inverted as explained above with reference to the current threshold value, a maximum voltage through the microphone that lies in the range of the conducting-state voltage of a diode, i.e. in the range of 0.6 V to 0.8 V, is adjusted if the connection polarity is inverted. The voltage measured at the connection between the supply terminal and the third switch corresponds to this voltage through the microphone. When the microphone is connected with correct polarity, in contrast, a higher voltage is adjusted that lies, for example, at approximately 1.5 V or close to half of the input signal voltage.

Accordingly, the voltage threshold value can be adjusted, for example, to a value that is higher than the voltage limit of the microphone when the polarity is inverted. For example, a voltage threshold value of 0.8 V to 1.0 V is used.

The current measurement or the current comparison and the voltage measurement or the voltage comparison may be used alternatively or in combination. In a combination, the measurements or comparisons may take place simultaneously or successively. The threshold values may be permanently adjusted in the evaluation device. However, it would also be possible for the detection circuit to feature a register, a One-Time Programmable or OTP memory, an EEPROM or the like, in which the threshold value or the threshold values are stored. In this way, it is possible, for example, to carry out a device-specific adaptation prior to the installation of the detection circuit into a mobile communication device or the like.

According to another embodiment, the evaluation device is designed for shifting into the test phase when a connection of a microphone is detected, particularly detected by means of an electromechanical contact. For example, a plug socket, into which a plug of the connected microphone is inserted, features an electromechanical contact that signals the connection during the insertion. The connection of a microphone can also be detected with other methods that are based, for example, on optical or magnetic principles. In case of a detection, the test phase can be initialized, in particular, prior to an actual operating phase.

The different embodiments of the detection circuit can be utilized, in particular, in a mobile communication device such as, for example, a mobile telephone, a notebook, a tablet PC or the like. In this case, the detection circuit may feature, in particular, a terminal for outputting a microphone signal that is coupled to the connection between the supply terminal and the third switch.

One embodiment of a method for detecting the polarity of a microphone that is connected to a first and a second contact terminal comprises connecting the second contact terminal to a reference potential terminal in a switched fashion and connecting the first contact terminal to a supply terminal in a switched fashion in order to supply the input signal via a changeover switch. In this method, a measurement signal is acquired at a connection between the supply terminal and the changeover switch in response to the supplied input signal, and the acquired measurement signal is compared to a threshold value. The polarity of the connected microphone is determined based on this comparison. For example, a first terminal configuration is produced due to the switched connection.

In one embodiment of the method, the connection of the first contact terminal to the supply terminal and the connection of the second contact terminal to the reference potential terminal are maintained if the polarity of the connected microphone corresponds to a defined polarity. If the polarity of the connected microphone does not correspond to the defined polarity, the polarity of the connected microphone is inverted in that the first contact terminal is connected to the reference potential terminal in a switched fashion and the second contact terminal is disconnected from the reference potential terminal and connected to the supply terminal via the changeover switch. For example, a second switching configuration that causes the inverted polarity is accordingly set.

In different embodiments, for example, an additional measurement signal is acquired at the connection between the supply terminal and the changeover switch if the polarity of the connected microphone is inverted, wherein the additional measurement signal is compared to a threshold value and it is determined whether the inverted polarity of the connected microphone corresponds to the defined polarity based on this comparison.

According to another embodiment, a value, particularly a current value, of the input signal is limited to a limit value during the acquisition, particularly a time-variant limit value, by means of the changeover switch.

Other embodiments of the method result from the different embodiments described with reference to the detection circuit. The method can be utilized, for example, in a mobile communication device.

Several embodiment examples of the invention are described in greater detail below with reference to the figures. In the figures, elements that respectively function or act identically are identified by the same reference symbols.

Figure 1:
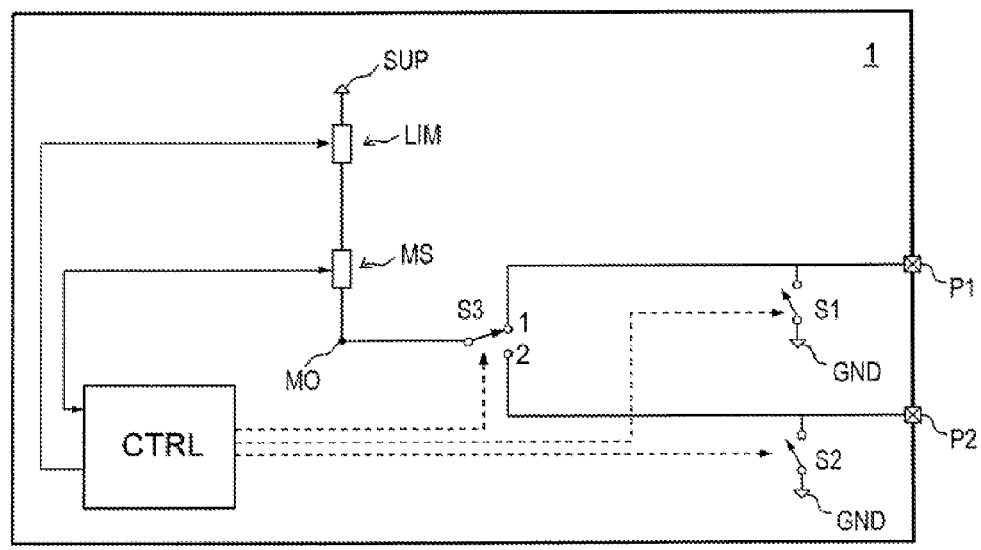
FIG. 1 shows an embodiment example of a detection circuit.

FIG. 1 shows an embodiment example of a detection circuit 1 that comprises a first and a second contact terminal P1, P2. The first contact terminal P1 is connected in a switchable fashion to a reference potential terminal GND via a first switch S1. Similarly, the second contact terminal P2 is connected in a switchable fashion to the reference potential terminal GND via a second switch S2. The detection circuit 1 furthermore comprises a third switch S3 that is realized in the form of a changeover switch and connects a terminal MO to the first contact terminal P1 in a first switch position that is identified by the numeral 1 and to the second contact terminal P2 in a second switch position that is identified by the numeral 2. The terminal MO is connected to a supply terminal SUP, wherein a measuring device MS, as well as a limiting circuit LIM, is coupled to the connection between the third switch S3 or the terminal MO and the supply terminal SUP. The detection circuit 1 furthermore features an evaluation device CTRL that is coupled to the limiting circuit LIM and the measuring device MS. The evaluation device furthermore features control outputs and control lines for activating the switches S1, S2 and S3.

The contact terminals P1, P2 are provided for connecting a microphone, particularly a microphone with a defined polarity. A proper operation of a connected microphone is only ensured, in particular, with consideration of the defined polarity of the microphone. During the operation of the detection circuit, an input signal is supplied to the supply terminal SUP from a not-shown external source.

The evaluation device CTRL is designed, in particular, for controlling the switch positions of the switches S1, S2, S3 in such a way that the input signal is routed either from the supply terminal to the second contact terminal P2 via the first contact terminal P1 and then from the second contact terminal to the reference potential terminal GND via the switch S2, or from the supply terminal SUP via the second contact terminal P2 and from there to the reference potential terminal GND via the first contact terminal P1 and the first switch S1. This is respectively based on the assumption of an external contacting of the contact terminals P1, P2, for example, by the provided microphone.

The contact terminals P1, P2 are connected, for example, to contacts of a plug socket that serves for receiving a plug of a microphone or a headset with integrated microphone.

The embodiment illustrated in FIG. 1 therefore makes it possible to invert a polarity of a signal at the contact terminals P1, P2 by changing the switch positions of the switches S1, S2, S3.

For example, a first switching configuration that corresponds to a first polarity is set in a test phase when a microphone is connected to the contact terminals P1, P2. In one embodiment, the input signal is in this switching configuration routed via the connected microphone in accordance with the chosen switch position. In this case, a value, particularly a current value of the input signal, can be limited to a limit value by means of the limiting circuit LIM, wherein the limiting can be controlled by the evaluation device CTRL. The measuring device MS makes it possible to acquire a measurement signal, for example, in the form of a current signal or a voltage signal. The measurement signal is made available to the evaluation device CTRL in order to be evaluated. The evaluation device CTRL carries out, in particular, a comparison of the measurement signal to a threshold value in order to determine an actual polarity of the connected microphone based on this comparison. This determination in turn makes it possible to detect, in particular, whether the polarity of the connected microphone corresponds to a defined polarity, i.e. whether a proper operation of the microphone is possible. If it is determined that the connected microphone has a suitable polarity, the switching configuration being set during the measurement can also be set or maintained for an operating phase.

However, a second switching configuration, in which the polarity at the contact terminals P1, P2 is inverted as described above, can be set if the measurement or the evaluation of the measurement shows that the microphone is not connected with a suitable polarity. In different embodiments, this second switching configuration can be directly utilized for an operating phase, wherein it is in this case assumed that the second switching configuration results in a suitable polarity of the connected microphone.

It is furthermore possible to carry out an additional measurement and a corresponding evaluation of the additional measurement in the second switching configuration in order to once again determine the polarity of the connected microphone in the second switching configuration. If the thus determined polarity of the connected microphone is suitable for the second switching configuration, this second switching configuration therefore can be maintained or set for an operating phase. Although it can be assumed that the second switching configuration results in a suitable polarity for the connected microphone if the first switching configuration was determined as unsuitable, the additional measurement and evaluation improve the certainty in the determination of the detection result.

The comparison of the measurement signal to the threshold value in the test phases is based on the fact that, if properly connected, an inherent current limiting for the current flowing through the microphone is realized with a microphone that has a defined polarity such as, for example, an electret microphone. If a proper connection is produced, a defined voltage that corresponds, for example, to approximately half the voltage value of the input signal is usually also adjusted.

If an improper connection is produced, such a microphone usually has a diode-like characteristic such that the microphone causes a voltage drop on the order of the conducting-state voltage of a diode. In addition, no current limiting takes place, but the current through the microphone rather increases roughly exponentially as is the case with a diode in the conducting direction.

Accordingly, a comparison of the measurement signal to a current threshold value can be carried out in the evaluation device CTRL, wherein a correct polarization of the connected microphone is indicated if the measurement signal falls short of the threshold value, and an unsuitable polarity is indicated if the measurement signal exceeds the threshold value. A comparison of the measurement signal to a voltage threshold value may be alternatively or additionally carried out, wherein a voltage threshold value that lies above a conducting-state voltage of a diode is exceeded when a microphone is properly connected, while the measurement signal falls short of this voltage threshold value when a microphone is improperly connected.

Figure 2A:
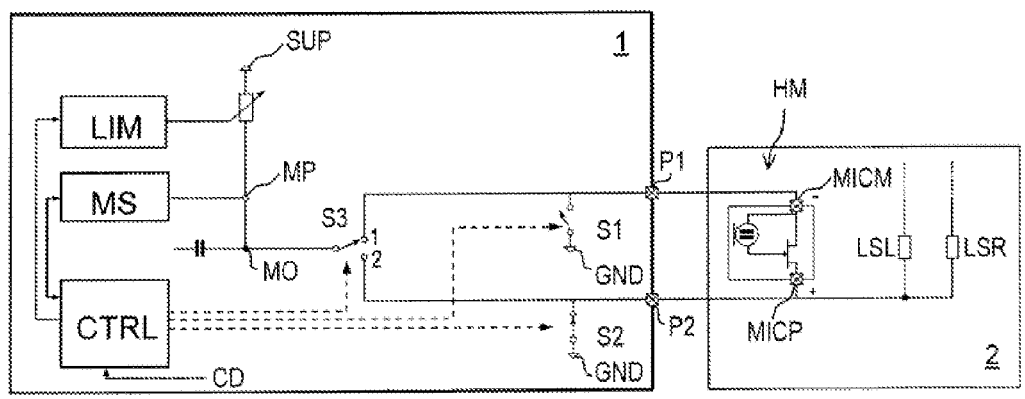
FIG. 2 shows embodiments of the detection circuit with a connected microphone.
Figure 2B:
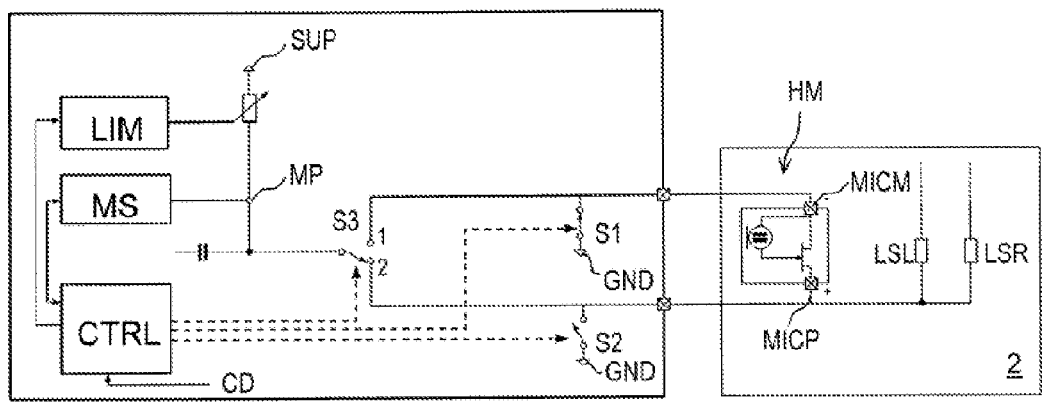

FIG. 2A and FIG. 2B each show an embodiment of a detection circuit 1 with a microphone HM that is connected to the contact terminals P1, P2. The microphone HM is integrated, for example, into a headset 2 with two loudspeakers that are illustrated in the form of equivalent resistances LSL, LSR. The microphone HM is illustrated as an example in the form of an equivalent circuit diagram of an electret microphone and features a positive pole MICP and a negative pole MICM that distinctly define the polarity of the microphone HM.

In this embodiment example, the evaluation device CTRL features an additional input for supplying a connection detection signal CD that signals, for example, the connection of the headset 2 or the microphone HM. A detection of the connection is realized, for example, with an electromechanical contact that is integrated into a plug socket and directly or indirectly delivers the connection detection signal CD when a plug of the headset 2 is inserted into the plug socket. The connection of a microphone can also be detected with other methods that are based, for example, on optical or magnetic principles. A test phase can be initialized by the evaluation device CTRL, for example, when the connection of the headset 2 or the microphone HM is signaled.

In this embodiment, the limiting circuit LIM features a control section and a controllable resistor that is arranged in the connection between the supply terminal SUP and the terminal MO or the third switch S3. The measuring device MS in this embodiment is coupled to a measuring point MP on this connection.

The controllable resistor of the limiting circuit LIM is realized, for example, in the form of a controlled transistor, wherein a conducting-state D.C. resistance of the transistor is adjusted by the control section of the limiting circuit LIM.

For example, a processing unit for the microphone signal may be coupled, particularly in a capacitive fashion, to the terminal MO in the operating phase. The terminal MO therefore serves, for example, as microphone output, at which a defined polarity of the connected microphone HM is ensured after one or more test phases.

A voltage measurement by means of the measuring device MS can be realized, for example, by simply tapping the voltage at the measuring point MP that, in terms of its potential, corresponds to the contact of the connected microphone that is assumed to be positive. For example, a precision resistor or shunt can be used in a current measurement by means of the measuring device MS. It is likewise possible to utilize a current mirror that mirrors the current flowing through the measuring point MP on a measuring branch. In this case, particularly the current in the measuring branch can be scaled down to a lower current value.

The embodiments of the detection circuit 1 illustrated in FIG. 2A and FIG. 2B have an identical design and only differ with respect to different switch positions of the switches S1, S2, S3. In FIG. 2A, it is assumed, in particular, that the contact terminal P1 represents the positive pole of a microphone to be connected such that the switch S3 is in the first switch position, in which the first contact terminal P1 is connected to the supply terminal SUP. The second contact terminal P2 is connected to the reference potential terminal GND via the closed switch S2.

In FIG. 2B, the switch positions are interchanged such that an inverted polarity results at the contact terminals P1, P2. Accordingly, the second contact terminal P2 is coupled to the supply terminal SUP via the switch S3 in the switch position 2 while the first contact terminal P1 is connected to the reference potential terminal GND via the closed switch S1.

Figure 3:
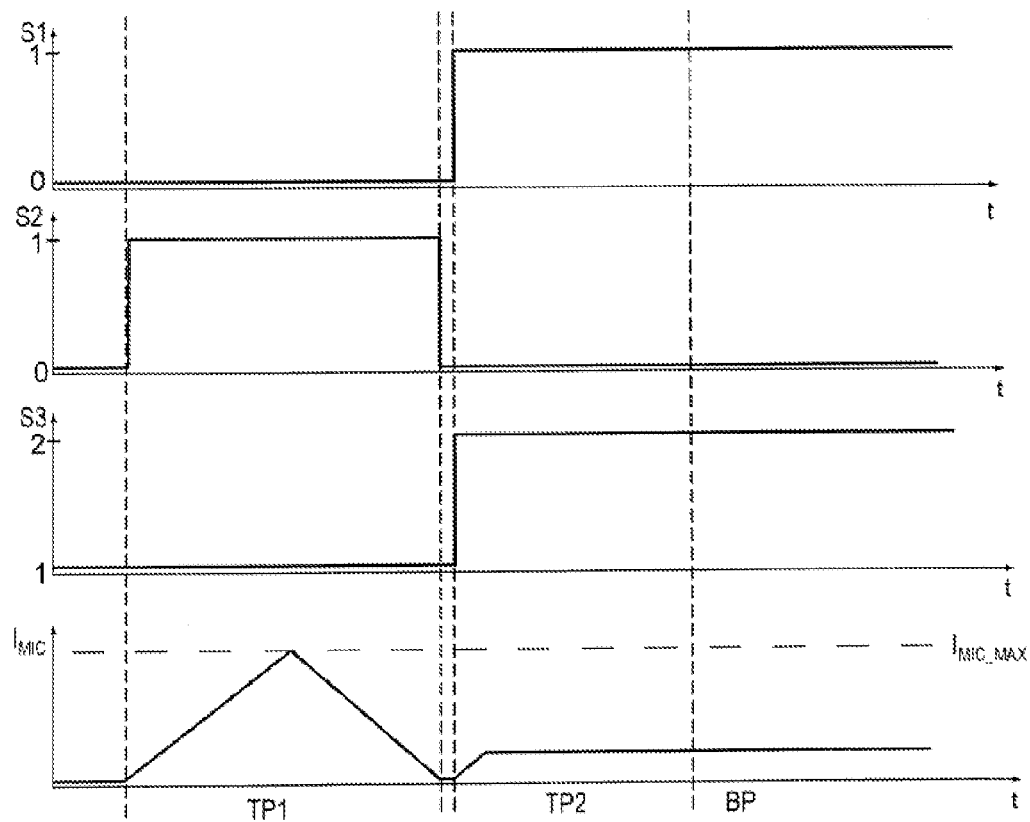
FIG. 3 shows an example signal-time diagram.

FIG. 3 shows an example signal-time diagram with switching signals for the switches S1, S2, S3 and a measured current $I_{MIC}$ through the measuring point MP. With respect to the switches S1, S2, the signal value 1 represents a closed switch and the signal value 0 represents an open switch. In a first test phase TP1, a switching configuration is set that corresponds to the switch position illustrated in FIG. 2A. The limiting circuit LIM continuously increases a limiting value for the input signal, particularly for a current of the input signal, from a minimum limit value. Consequently, the current $I_{MIC}$ through the microphone HM connected in accordance with FIG. 2 also increases continuously. Once the current threshold value $I_{MIC\_MAX}$ is respectively reached or exceeded, the evaluation device CTRL detects that the polarity of the connected microphone HM is unsuitable for the switching configuration being set. Accordingly, the limit value is once again continuously returned to the minimum limit value.

If the decrease of the limit value does not take place immediately when the current threshold value $I_{MIC\_MAX}$ is reached, different embodiments also make it possible to wait until the limit value increases to a maximum limit value. The increase of the limit value may not only take place continuously as shown, but also incrementally, in discrete steps or even abruptly up to the maximum limit value. However, a slower increase from the minimum to the maximum limit value, for example, in the range of 100 ms to 200 ms, results in a lower frequency for the current signal. This makes it possible, for example, to prevent noises in the headset that are caused, for example, by currents through protective diodes in an amplifier for the loudspeakers of the headset.

In a second test phase TP2, a second switching configuration is set that corresponds to the switch position in FIG. 2B. The limit value is once again increased and this increase also leads to an increase of the microphone signal $I_{MIC}$ at the beginning of the second test phase. A current limiting is also initiated in this case, however, by the connected microphone HM itself such that the microphone current $I_{MIC}$ does not increase further and remains at a constant or essentially constant current level. Since the current threshold value $I_{MIC\_MAX}$ therefore is not exceeded, it can be assumed that the polarity of the connected microphone HM is suitable for the switching configuration being set. This switching configuration accordingly can be maintained in an operating phase BP.

Figure 4:
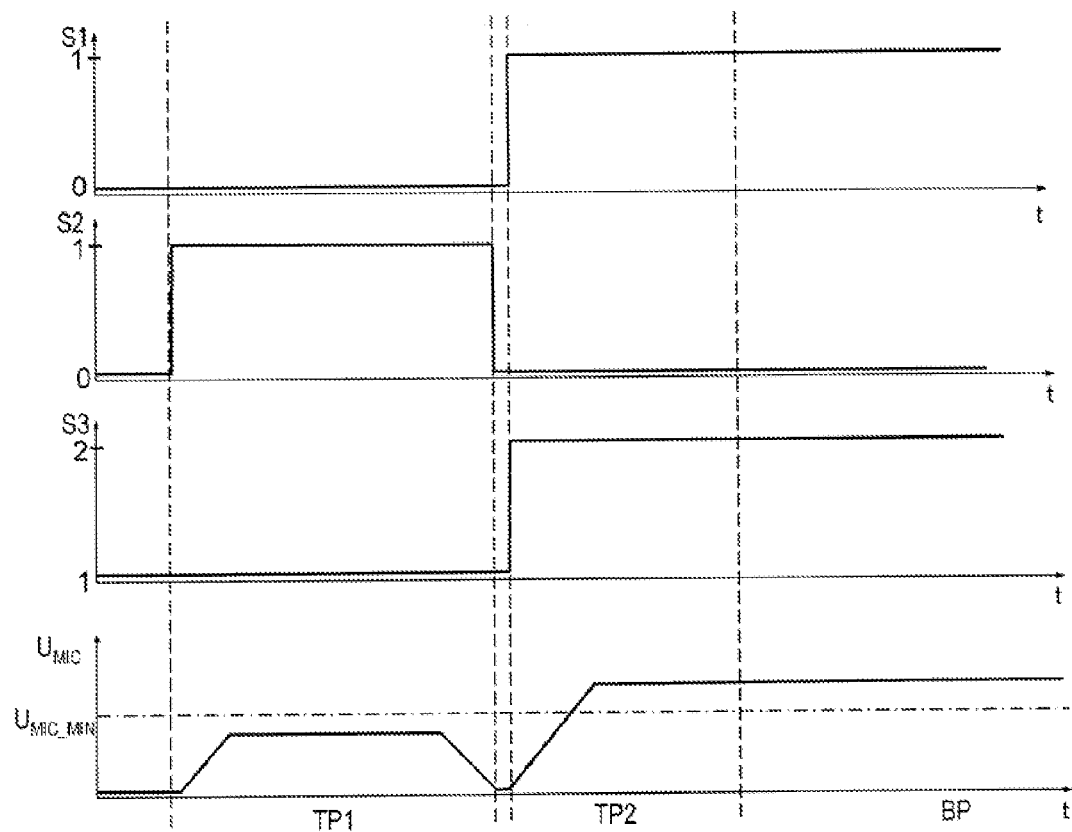
FIG. 4 shows another example signal-time diagram.

FIG. 4 shows another signal-time diagram, in which a voltage signal $U_{MIC}$ at the measuring point MP is illustrated in addition to the switching signals for the switches S1, S2, S3. The signals are once again based, for example, on the embodiments illustrated in FIG. 2A and FIG. 2B.

With reference to FIG. 3, the increase of the limit value for the input signal corresponds to the above-described method. During a voltage measurement in a first test phase TP1, the voltage signal $U_{MIC}$ therefore initially increases, but this increase begins to stagnate at a certain point in time such that the microphone voltage $U_{MIC}$ remains at a constant level that, with reference to the preceding explanations, lies approximately in the range of the conducting-state voltage of a diode. When the limit value is decreased, the microphone voltage $U_{MIC}$ also begins to decrease again at another point in time. Since the microphone voltage $U_{MIC}$ does not exceed the voltage threshold value $U_{MIC\_MIN}$ in the first test phase TP1, it can be assumed that the polarity of the connected microphone HM is unsuitable for the chosen switching configuration. Accordingly, a measurement is once again carried out in a second test phase TP with the changed switching configuration illustrated in FIG. 2B, wherein the microphone voltage $U_{MIC}$ increases to a higher value in this switching configuration and remains at a certain level. It can accordingly be assumed that the polarity of the microphone HM is suitable for the switching configuration in the second test phase, wherein this switching configuration is also maintained in a subsequent operating phase. For example, the voltage threshold value $U_{MIC\_MIN}$ can be chosen slightly higher than the conventional conducting-state voltage of a diode, for example at approximately 1 V.

The current measurement described with reference to FIG. 3 and the voltage measurement described with reference to FIG. 4 may also be combined for detection purposes, wherein a simultaneous current measurement and voltage measurement would be conceivable or the corresponding measurements may be carried out successively.

The respective threshold values $I_{MIC\_MAX}$ and $U_{MIC\_MIN}$ may be permanently adjusted in the evaluation device CTRL. However, the detection circuit 1 may also feature a register, a One-Time Programmable or OTP memory, an EEPROM or the like, in which the threshold value or the threshold values are stored. The detection circuit 1 features, for example, a programming interface that is not depicted. In this way, it is possible, for example, to carry out a device-specific adaptation prior to the installation of the detection circuit 1 into a mobile communication device or the like.

Figure 5:
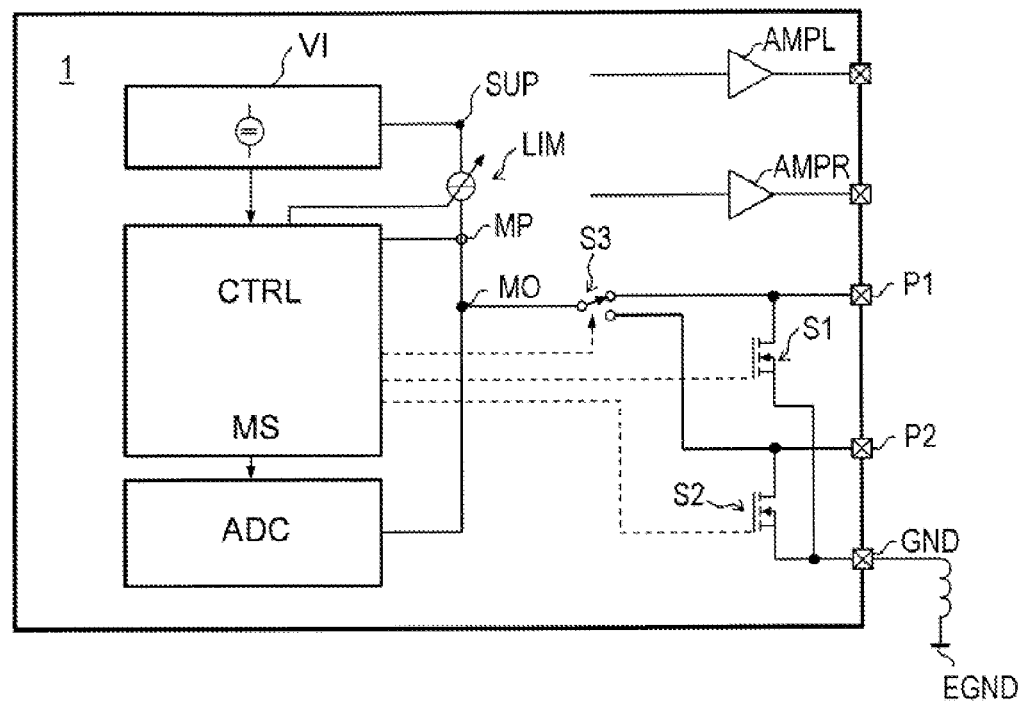
FIG. 5 shows another embodiment example of the detection circuit.

FIG. 5 shows another embodiment of a detection circuit 1 that is based on the above-described embodiments of the detection circuit 1. In this case, the first and the second switch S1, S2 are realized in the form of field effect transistors. The detection circuit 1 furthermore comprises a supply circuit VI that delivers a voltage signal with a predetermined current carrying capacity to the supply terminal SUP. An analog/digital converter ADC is connected to the microphone output MO and is capable of processing the applied microphone signal into a digital signal in the operating phase. The detection circuit 1 furthermore comprises two amplifiers AMPL, AMPR for amplifying audio signals that can be delivered, for example, to the loudspeakers of a connected headset with integrated microphone. The reference potential terminal GND is coupled to an external reference potential terminal EGND in this embodiment. The evaluation device CTRL and the measuring device MS are combined in one block.

Figure 6A:
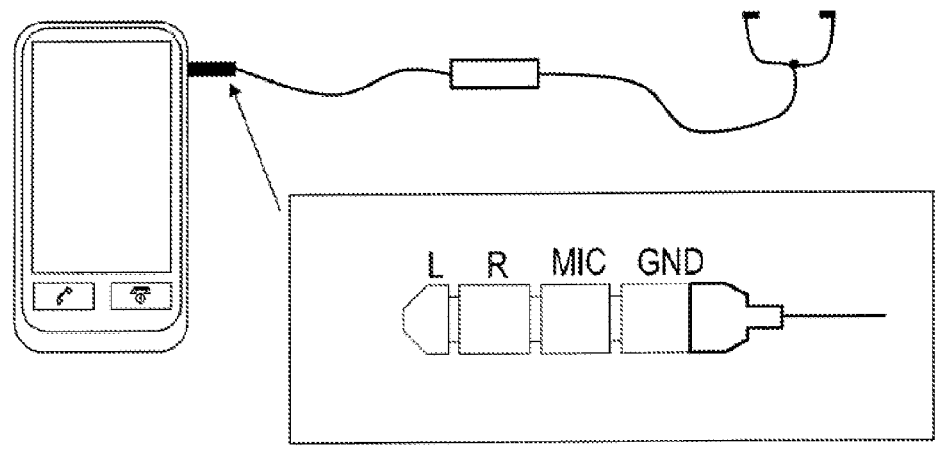
FIG. 6 shows different embodiments of a mobile communication device and a connected headset with microphone.
Figure 6B:
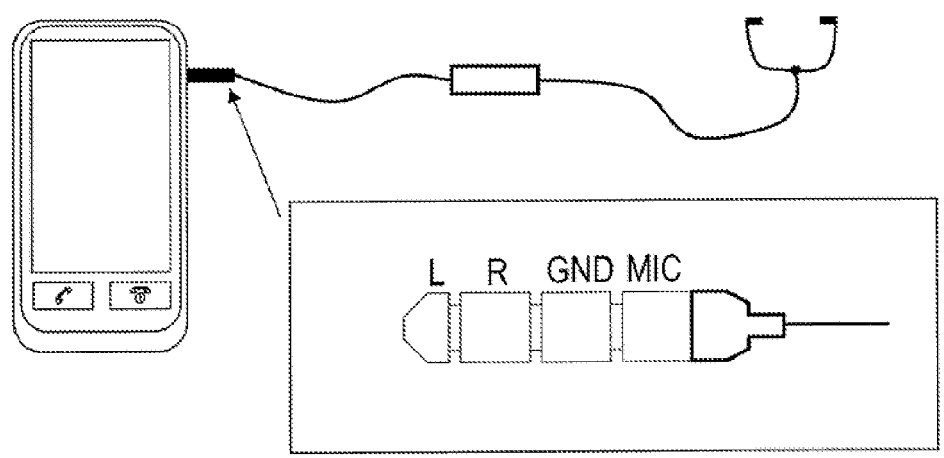

The different embodiments of a detection circuit 1 may be integrated, for example, on a chip in accordance with semiconductor technology. Such a detection circuit or such a chip with a detection circuit can be respectively utilized, in particular, in a mobile communication device such as, for example, a mobile telephone, a tablet PC or the like that features a corresponding jack socket, for example a four-pole jack socket. The detection circuit 1 may in this case be positioned in the vicinity of this socket in order to ensure a suitable reproduction of the corresponding signals regardless of a terminal configuration of the plug of a connected headset with integrated microphone. A user is therefore able to utilize a mobile communication device with such a detection circuit in connection with headsets according to the plug configuration in FIG. 6A and in connection with headsets according to the plug configuration in FIG. 6B without additional effort, wherein a proper function of an integrated microphone is ensured in any case.

The invention claimed is:

1. A detection circuit, comprising:
    a first and a second contact terminal for connecting a microphone with a defined polarity;
    a first switch that connects the first contact terminal to a reference potential terminal;
    a second switch that connects the second contact terminal to the reference potential terminal;
    a supply terminal for supplying an input signal via a third switch either to the first contact terminal or to the second contact terminal depending on a setting of the third switch;
    a measuring device for acquiring a measurement signal resulting in response to the supplied input signal only, wherein the measuring device is coupled to a connection between the supply terminal and the third switch; and
    an evaluation device that is designed for, in a test phase,
        setting a first switching configuration, wherein the first switch is in an open state, the first contact terminal is connected to the supply terminal via the third switch, and the second contact terminal is connected to the reference potential terminal via the second switch;
        comparing the measurement signal to a threshold value, wherein the threshold value is one of a voltage threshold value and a current threshold value; and
        determining whether the polarity of a connected microphone is suitable for the first switching configuration based on this comparison,
    wherein the third switch is a changeover switch,
    wherein the measuring device acquires the measurement signal at the connection between the supply terminal and the third switch, wherein the changeover switch is formed to adopt either of a first switch position and a second switch position, wherein in the first switch position the changeover switch connects the supply terminal to the first contact terminal, wherein in the second switch position the changeover switch connects the supply terminal to the second contact terminal, and wherein the evaluation device in the first switching configuration controls the changeover switch to adopt the first switch position.

2. The detection circuit according to claim 1, wherein the evaluation device is designed for maintaining the first switching configuration for an operating phase if the polarity of a connected microphone is suitable for the first switching configuration.

3. The detection circuit according to claim 1 or 2, wherein the evaluation device is designed for setting a second switching configuration, and wherein the second switch is in an open state, the first contact terminal is connected to the reference potential terminal via the first switch, and the second contact terminal is connected to the supply terminal via the third switch, if the polarity of a connected microphone is unsuitable for the first switching configuration.

4. The detection circuit according to claim 3, wherein the evaluation device is designed for maintaining or setting the second switching configuration for an operating phase if the polarity of a connected microphone is unsuitable for the first switching configuration.

5. The detection circuit according to claim 3, wherein the evaluation device is designed for comparing the measurement signal to the threshold value in an additional test phase with the second switching configuration and for determining whether the polarity of a connected microphone is suitable for the second switching configuration based on this comparison.

6. The detection circuit according to claim 5, wherein the evaluation device is designed for maintaining or setting the second switching configuration for an operating phase if the polarity of a connected microphone is suitable for the second switching configuration.

7. The detection circuit according to claim 5, further comprising a limiting circuit that is coupled to the supply terminal and designed for limiting a value, particularly a current value, of the input signal to a limit value.

8. The detection circuit according to claim 7, wherein the limiting circuit is designed for respectively allowing the limit value to increase from a minimum limit value to a maximum limit value in the test phase or in the additional test phase, particularly under the control of the evaluation device.

9. The detection circuit according to claim 5, wherein the measuring device is designed for measuring a current through the connection between the supply terminal and the third switch, and wherein the evaluation device is designed for determining that the polarity of a connected microphone is suitable if the measured current is lower than a current threshold value in the test phase or in the additional test phase.

10. The detection circuit according to claim 5, wherein the measuring device is designed for measuring a voltage at the connection between the supply terminal and the third switch, and wherein the evaluation device is designed for determining that the polarity of a connected microphone is suitable if the measured voltage is higher than a voltage threshold value in the test phase or in the additional test phase.

11. The detection circuit according to claim 1, wherein the evaluation device is designed for shifting into the test phase when a connection of a microphone is detected, particularly detected by means of an electromechanical contact.

12. A method for detecting the polarity of a microphone that is connected to a first and a second contact terminal, with the method comprising the steps of:

connecting the second contact terminal to a reference potential terminal in a switched fashion;

connecting the first contact terminal to a supply terminal in a switched fashion in order to supply an input signal to the microphone via a changeover switch;

acquiring a measurement signal at a connection between the supply terminal and the changeover switch while the input signal is supplied to the microphone, the measurement signal resulting in response to the supplied input signal only;

comparing the acquired measurement signal to a threshold value, wherein the threshold value is one of a voltage threshold value and a current threshold value; and determining the polarity of the connected microphone based on this comparison, wherein the changeover switch is formed to adopt either of a first switch position and a second switch position, wherein in the first switch position the changeover switch connects the supply terminal to the first contact terminal, wherein in the second switch position the changeover switch connects the supply terminal to the second contact terminal, and wherein the step of connecting the first contact terminal to the supply terminal in order to supply an input signal to the microphone comprises: controlling the changeover switch to adopt the first switch position.

13. The method according to claim 12, wherein the connection of the first contact terminal to the supply terminal and the connection of the second contact terminal to the reference potential terminal are maintained if the polarity of the connected microphone corresponds to a defined polarity, and wherein the polarity of the connected microphone is inverted in that the first contact terminal is connected to the reference potential terminal in a switched fashion and the second contact terminal is disconnected from the reference potential terminal and connected to the supply terminal via the changeover switch if the polarity of the connected microphone does not correspond to the defined polarity.

14. The method according to claim 13, wherein an additional measurement signal is acquired at the connection between the supply terminal and the changeover switch if the polarity of the connected microphone is inverted, and wherein the additional measurement signal is compared to a threshold value and it is determined whether the inverted polarity of the connected microphone corresponds to the defined polarity based on this comparison.

15. The method according to claim 12, wherein a value, particularly a current value, of the input signal is limited to a limit value during the acquisition, particularly a time-variant limit value, by means of the changeover switch.

16. The method according to claim 15, wherein the limit value increases from a minimum limit value to a maximum limit value.

17. The detection circuit according to claim 1, wherein the input signal is a voltage signal with a predetermined current carrying capacity.

18. The method according to claim 12, wherein the input signal is a voltage signal with a predetermined current carrying capacity.

\* \* \* \* \*